(12) United States Patent
Takahashi (10) Patent No.: US 7,416,677 B2
(45) Date of Patent: Aug. 26, 2008

(54) EXHAUST ASSEMBLY FOR PLASMA PROCESSING SYSTEM AND METHOD

(75) Inventor: Hiroyuki Takahashi, North Andover, MA (US)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 11/464,003

(22) Filed: Aug. 11, 2006

(65) Prior Publication Data

US 2008/0035605 A1    Feb. 14, 2008

(51) Int. Cl.
*B44C 1/22* (2006.01)
*C03C 15/00* (2006.01)
*C03C 25/68* (2006.01)
*C23F 1/00* (2006.01)

(52) U.S. Cl. .................... 216/71; 156/345.47
(58) Field of Classification Search ............ 156/345.47; 216/71, 67; 118/723 E, 723 AN, 715
See application file for complete search history.

(56) References Cited

U.S. PATENT DOCUMENTS 5,983,906 A * 11/1999 Zhao et al. .............. 134/1.1
6,899,527 B2 * 5/2005 Quon et al. .............. 417/49
2006/0037701 A1    2/2006 Koshiishi et al.

FOREIGN PATENT DOCUMENTS

JP    05047712 A *    2/1993

* cited by examiner

*Primary Examiner*—Roberts Culbert
(74) *Attorney, Agent, or Firm*—Wood, Herron & Evans, L.L.P.

(57) ABSTRACT

An exhaust assembly is described for use in a plasma processing system, whereby secondary plasma is formed in the exhaust assembly between the processing space and chamber exhaust ports in order to reduce plasma leakage to a vacuum pumping system, or improve the uniformity of the processing plasma, or both. The exhaust assembly includes a powered exhaust plate in combination with a ground electrode is utilized to form the secondary plasma surrounding a peripheral edge of a substrate treated in the plasma processing system.

9 Claims, 11 Drawing Sheets

EXHAUST ASSEMBLY FOR PLASMA PROCESSING SYSTEM AND METHOD

FIELD OF INVENTION

The present invention relates to a method and apparatus for plasma processing a substrate, and more particularly to a method and system for operating a processing system to adjust the spatial uniformity of a processing plasma.

DESCRIPTION OF RELATED ART

During semiconductor processing, a (dry) plasma etch process can be utilized to remove or etch material along fine lines or within vias or contacts that are patterned on a silicon substrate. The plasma etch process generally involves positioning in a processing chamber a semiconductor substrate having an overlying patterned, protective layer, for example a photoresist layer. Once the substrate is positioned within the chamber, an ionizable, dissociative gas mixture is introduced into the chamber at a pre-specified flow rate, while a vacuum pump is throttled to achieve an ambient process pressure. Thereafter, a plasma is formed when a fraction of the gas species present is ionized by electrons heated via the transfer of radio frequency (RF) power, either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required, include, for example, silicon dioxide ($SiO_2$), low-k dielectric materials, poly-silicon, and silicon nitride.

SUMMARY OF THE INVENTION

According to principles of the invention, a method and system are provided that include operating a processing apparatus to reduce leakage of processing plasma to a vacuum pumping system of the processing apparatus.

According to certain embodiments of the invention, an exhaust assembly of the processing apparatus is operated to reduce leakage of the plasma to the vacuum pumping system.

According to other embodiments of the invention, a method and system are described for operating an exhaust system of the processing apparatus to adjust the spatial uniformity of the processing plasma utilized to treat the substrate.

According to still other embodiments of the invention, a method for treating a substrate is provided, and a computer readable medium is provided with program instructions to cause a computer system to control a plasma processing system according to the method.

According to certain described embodiments of the invention, a method is provided that comprises: disposing said substrate on a substrate holder in a plasma processing chamber; forming a processing plasma in a process space above and adjacent said substrate using a plasma generation system coupled to said plasma processing chamber; disposing an exhaust assembly within said plasma processing chamber such that said exhaust assembly substantially surrounds said substrate holder and separates said process space from a pumping space coupled to a vacuum pumping system; coupling electrical power to said exhaust assembly thereby forming a secondary plasma in order to alter said processing plasma; and exposing said substrate to said altered processing plasma.

According to other described embodiments of the invention, a plasma processing system configured to process a substrate with plasma is provided comprising a plasma processing chamber configured to facilitate the formation of a processing plasma; a substrate holder coupled to said plasma processing chamber and configured to support said substrate; a plasma generation system coupled to said plasma processing chamber and configured to form said processing plasma from a process gas in a process space adjacent said substrate; a vacuum pumping system coupled to said plasma processing chamber and configured to evacuate said process gas; an exhaust assembly coupled to said plasma processing chamber around said substrate holder and separating said process space from a pumping space coupled to said vacuum pumping system; and an electrical power source coupled to said exhaust assembly and configured to form a secondary plasma in order to alter said processing plasma.

DETAILED DESCRIPTION OF PREFERRED EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photoresist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

During pattern etching, a dry plasma etching process is often utilized, wherein plasma is formed from a process gas by coupling electromagnetic (EM) energy, such as radio frequency (RF) power, to the process gas in order to heat electrons and cause subsequent ionization and dissociation of the atomic and/or molecular composition of the process gas. Furthermore, an optional (negative) direct current (DC) voltage can be coupled to the plasma processing system in order to create a ballistic electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as U.S. patent application Ser. No. 2006/0037701A1; the entire contents of which are herein incorporated by reference in their entirety.

While the properties of the plasma and associated chemistry as well as the properties of the optional ballistic electron beam are important, the spatial uniformity of the plasma properties is also very important. Due to the difference in mobility between electrons and ions, which are respectively relatively more and less mobile, a plasma sheath forms on surfaces bounding the plasma and a plasma potential greater than that of the boundary surfaces forms for the bulk plasma. As a result, the plasma diffuses throughout the plasma volume seeking such ground surfaces.

Figure 1A:
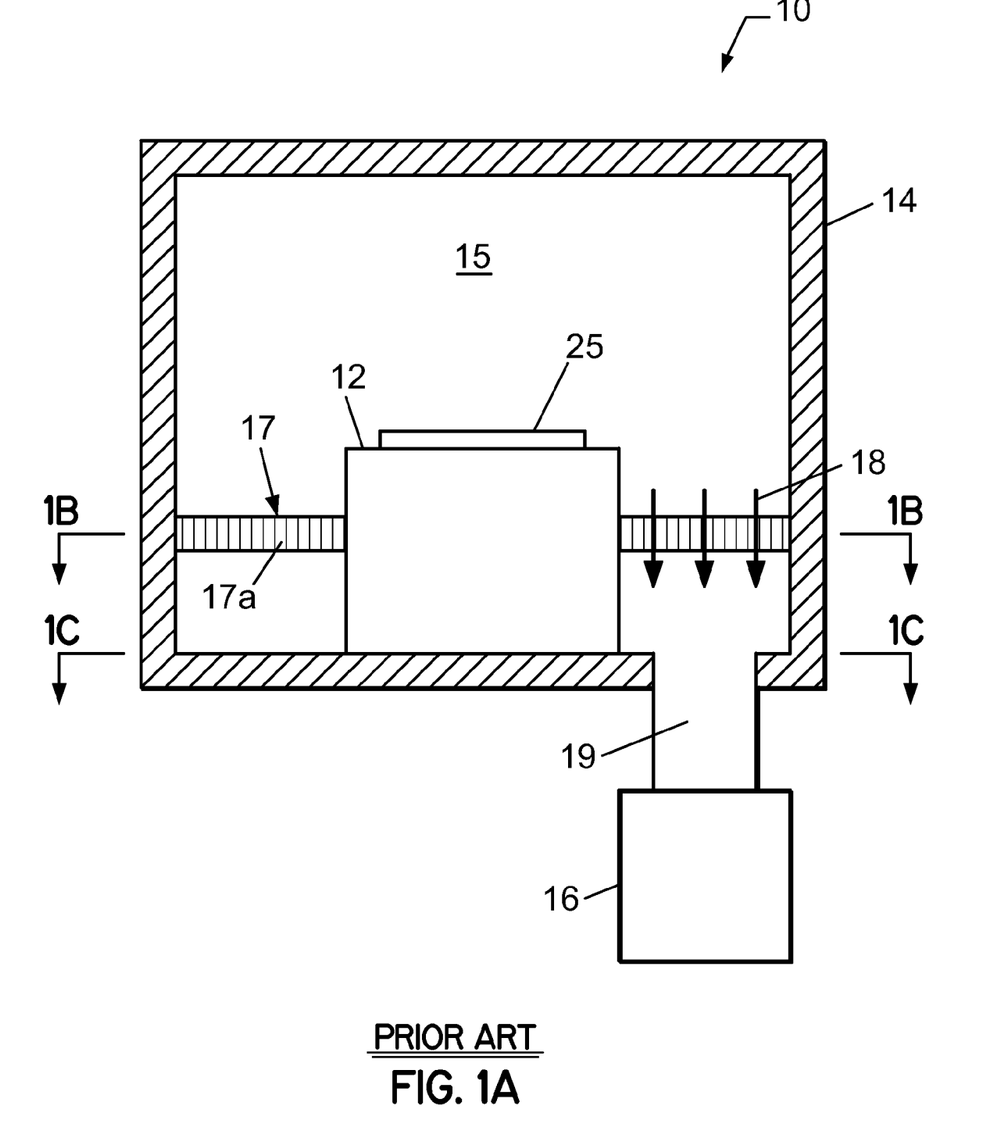
FIG. 1A presents a schematic representation of a plasma processing system of the prior art.

In order to counter the diffusion of plasma to systems susceptible to plasma damage, such as the vacuum pumping system, devices are utilized to confine the plasma to the processing space proximate the substrate. For example, an exhaust assembly consisting of an electrically grounded baffle plate has been used for such a purpose. Referring now to FIG. 1A, a schematic illustration of a plasma processing system 10 incorporating a conventional baffle plate is presented. The plasma processing system 10 comprises a plasma processing chamber 14 configured to facilitate the formation of a processing plasma in process space 15, a substrate holder 12 coupled to the plasma processing chamber 14 and configured to support substrate 25, and a vacuum pumping system 16 coupled to the plasma processing chamber 14 and configured to evacuate process space 15 through vacuum pumping port 19.

Figure 1B:
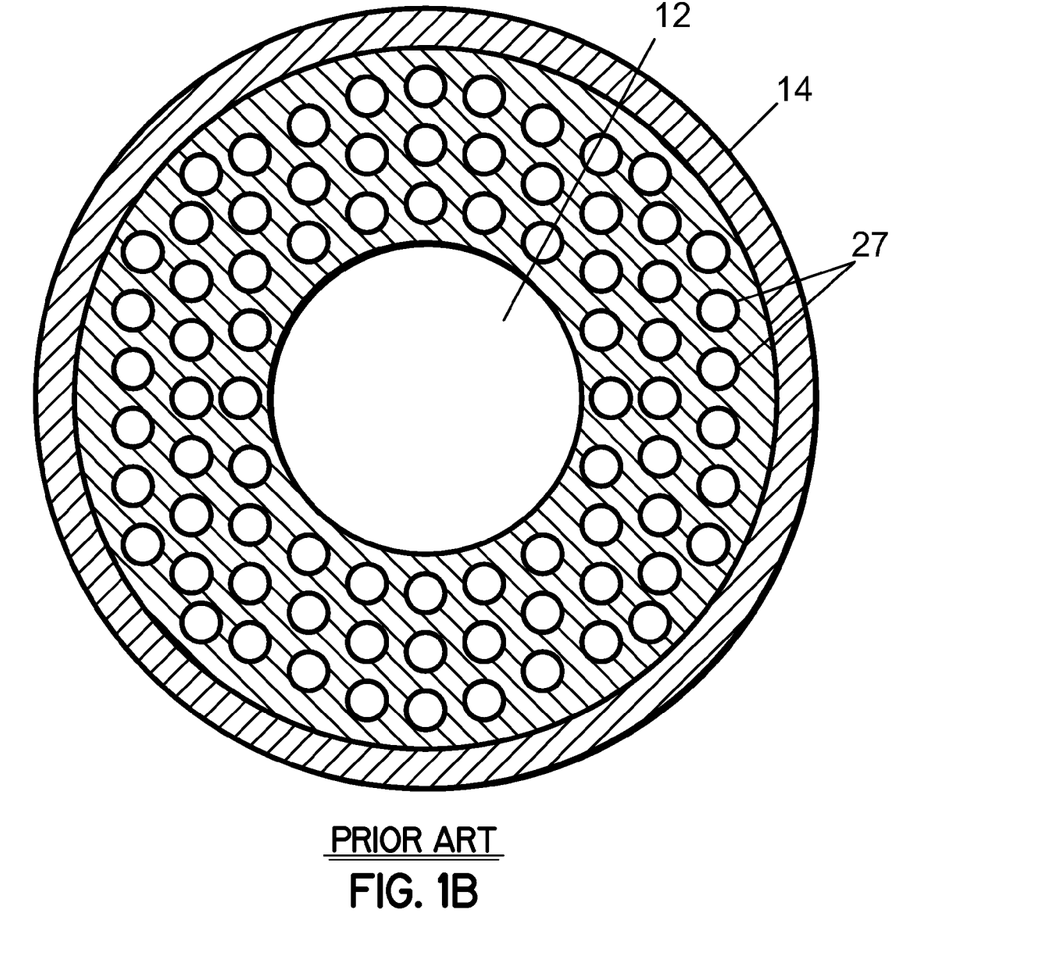
FIG. 1B presents a cross-sectional plan view along line 1B-1B of FIG. 1A of the exhaust assembly for the plasma processing system depicted in FIG. 1A.
Figure 1C:
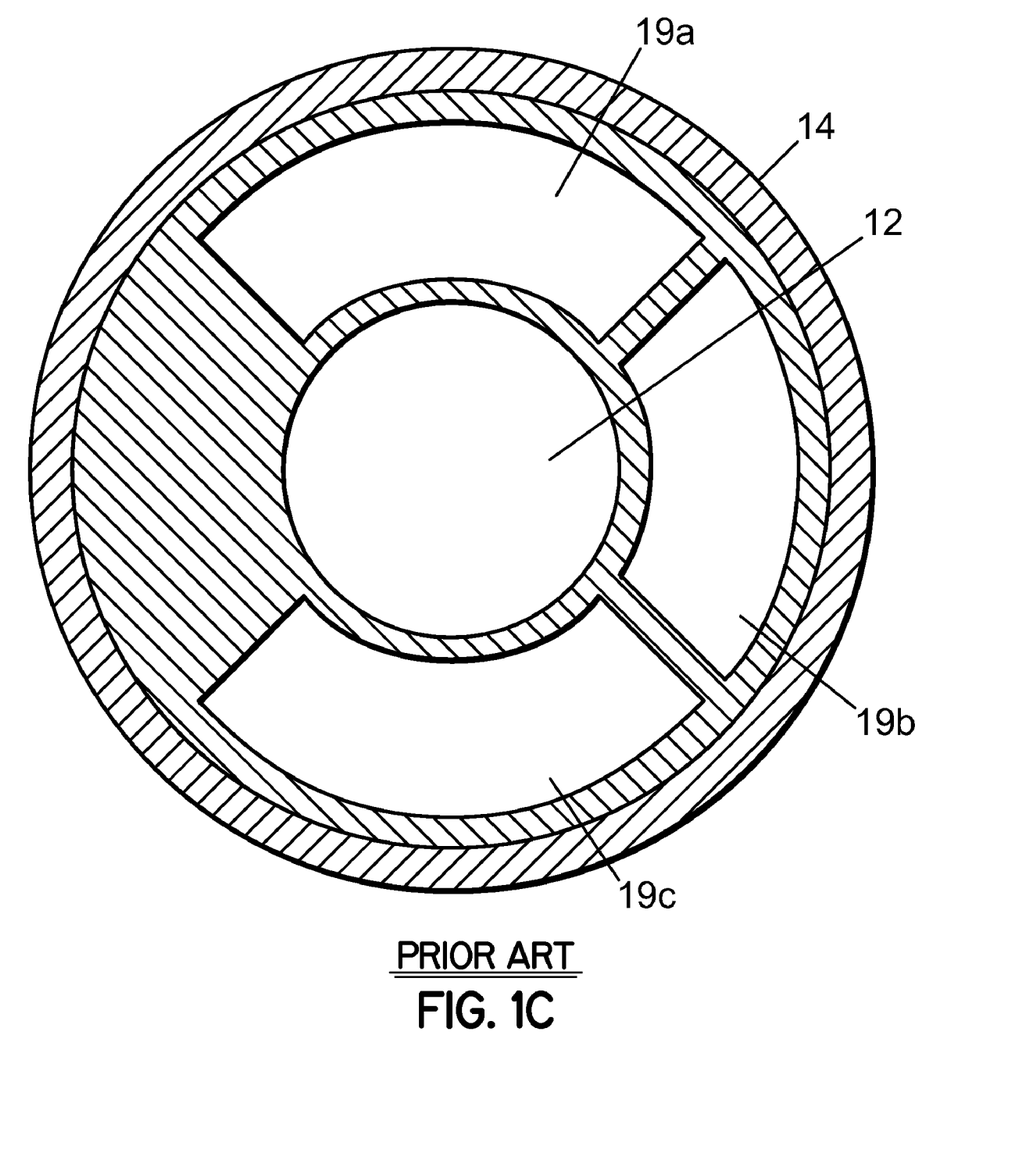
FIG. 1C presents a cross-sectional plan view along line 1C-1C of FIG. 1A of the pumping port for the plasma processing system depicted in FIG. 1A.

Additionally, the plasma processing system 10 comprises an exhaust assembly 17 consisting of a baffle plate 17a with a plurality of openings 27 to allow the passage of process gases there-through from process space 15 to vacuum pumping system 16 (see FIG. 1B). In order to permit the coupling of various utility connections to substrate holder 12, the vacuum pumping port 19 does not extend entirely around the perimeter of substrate holder 12. As shown in FIG. 1C, the vacuum pumping port 19 can include three openings 19a, 19b, 19c, through which process gases pass on to a vacuum pump.

The use of the baffle plate 17a is intended to relieve the process space 15 of pressure non-uniformity due to the asymmetric pumping. Moreover, the use of the baffle plate 17a is intended to reduce the leakage of plasma from process space 15 to vacuum pumping system 16. However, the inventor has observed an asymmetry in the leakage 18 of plasma from process space 15 through the exhaust assembly 17 due to the asymmetry of the vacuum pumping port 19. As a result, non-uniform treatment of substrate 25 is observed as well as excessive plasma leakage to vacuum pumping system 16. One approach to reduce the observed plasma leakage is to reduce the diameter of the openings in the baffle plate 17a. However, this reduction is performed at the expense of the flow conductance through the baffle plate, thus dramatically reducing the ability to deliver a desired pumping speed to the process space 15.

Figure 2:
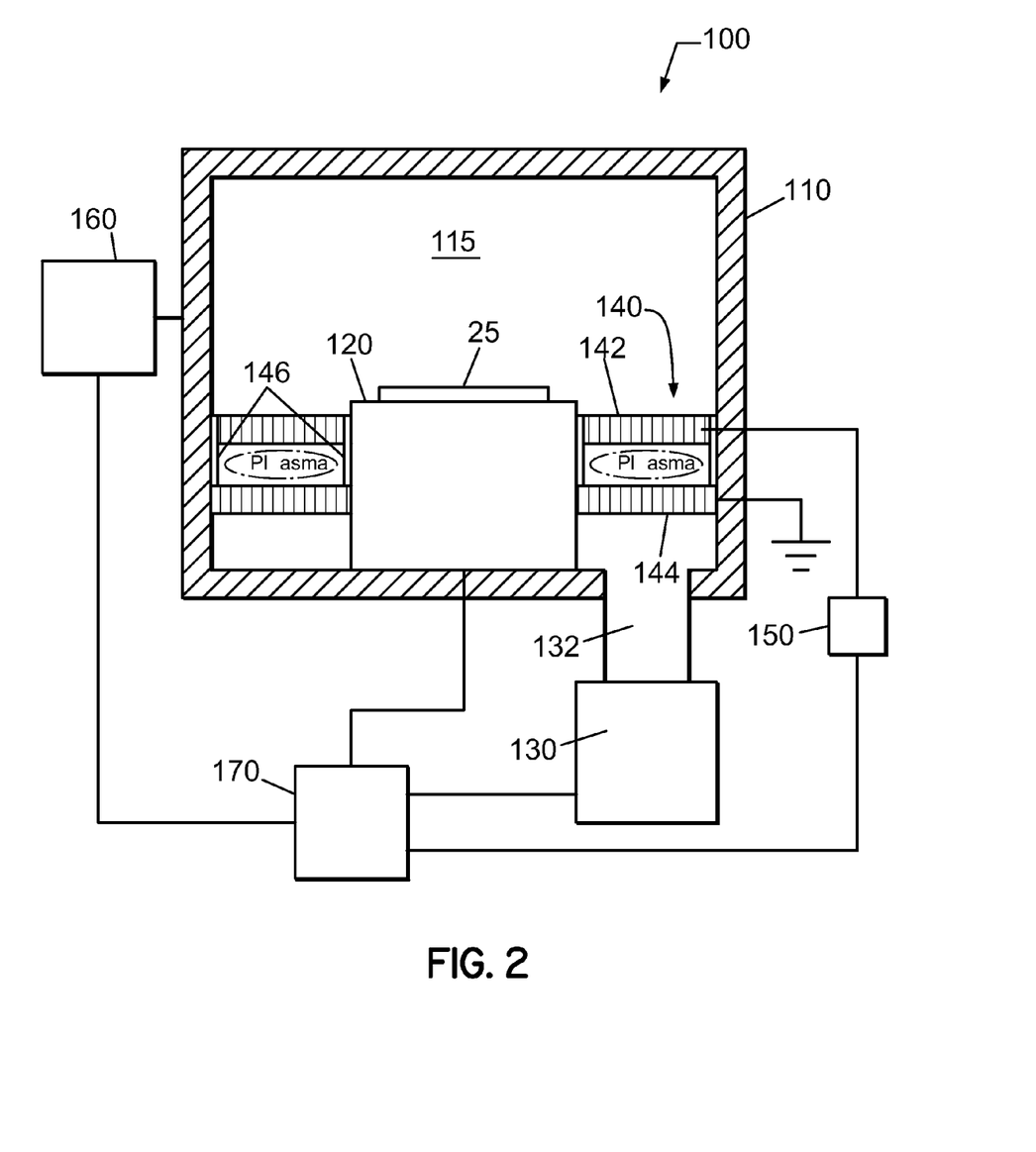
FIG. 2 presents a schematic representation of a plasma processing system having an exhaust assembly according to an embodiment of the invention.

Referring now to FIG. 2, a processing system 100 and an exhaust assembly therefor are provided according to an embodiment of the invention. A plasma processing system 100 is illustrated comprising a plasma processing chamber 110 configured to facilitate the formation of plasma in a process space 115, a substrate holder 120 coupled to the plasma processing system 110 and configured to support substrate 25, and a vacuum pumping system 130 coupled to plasma processing chamber 110 via pumping port 132 and configured to evacuate process gases from process space 115. Additionally, plasma processing system 100 comprises a plasma generation system 160 coupled to the plasma processing chamber 110 and configured to form processing plasma from a process gas in process space 115.

The plasma generation system 160 may comprise one or more of a capacitively coupled plasma (CCP) system, an inductively coupled plasma (ICP) system, a transformer coupled plasma (TCP) system, an electron cyclotron resonance (ECR) plasma system, a helicon wave plasma system, a surface wave plasma system, or a slotted plane antenna (SPA) plasma system, or a combination of two or more thereof. Each plasma system described above is well known to those skilled in the art.

Referring still to FIG. 2, plasma processing system 100 further comprises an exhaust assembly 140 configured to generate a secondary plasma. Exhaust assembly 140 comprises a first exhaust plate 142 coupled to a power source 150, a second exhaust plate 144 coupled to electrical ground, and electrical insulation rings 146 configured to electrically insulate the first exhaust plate from substrate holder 120 and the (electrically grounded) walls of process chamber 110. As illustrated in FIG. 2, the first and second exhaust plates 142, 144 surround substrate holder 120 and form the secondary plasma there-between.

Power source 150 can include a direct current (DC) electrical power source or an alternating current (AC) electrical power source. For example, power source 150 can include a radio frequency (RF) power source configured to couple RF power to the first exhaust plate 142.

The first exhaust plate 142 and the second exhaust plate 144 can be fabricated from a metal, such as aluminum or anodized aluminum. Additionally, the first exhaust plate 142 and the second exhaust plate 144 can be coated with a ceramic, such as aluminum oxide or yttrium oxide. For example, each exhaust plate may be coated with a material selected from the group consisting of $Al_2O_3$, $Sc_2O_3$, $Sc_2F_3$, $YF_3$, $La_2O_3$, $Y_2O_3$, and $DyO_3$.

Referring still to FIG. 2, plasma processing system 100 further comprises a controller 170 coupled to plasma processing chamber 110, substrate holder 120, plasma generation system 160, power system 150 and vacuum pumping system 130, and configured to exchange data with each of these components in order to execute a process within the plasma processing chamber 110 to treat substrate 25.

Figure 3:
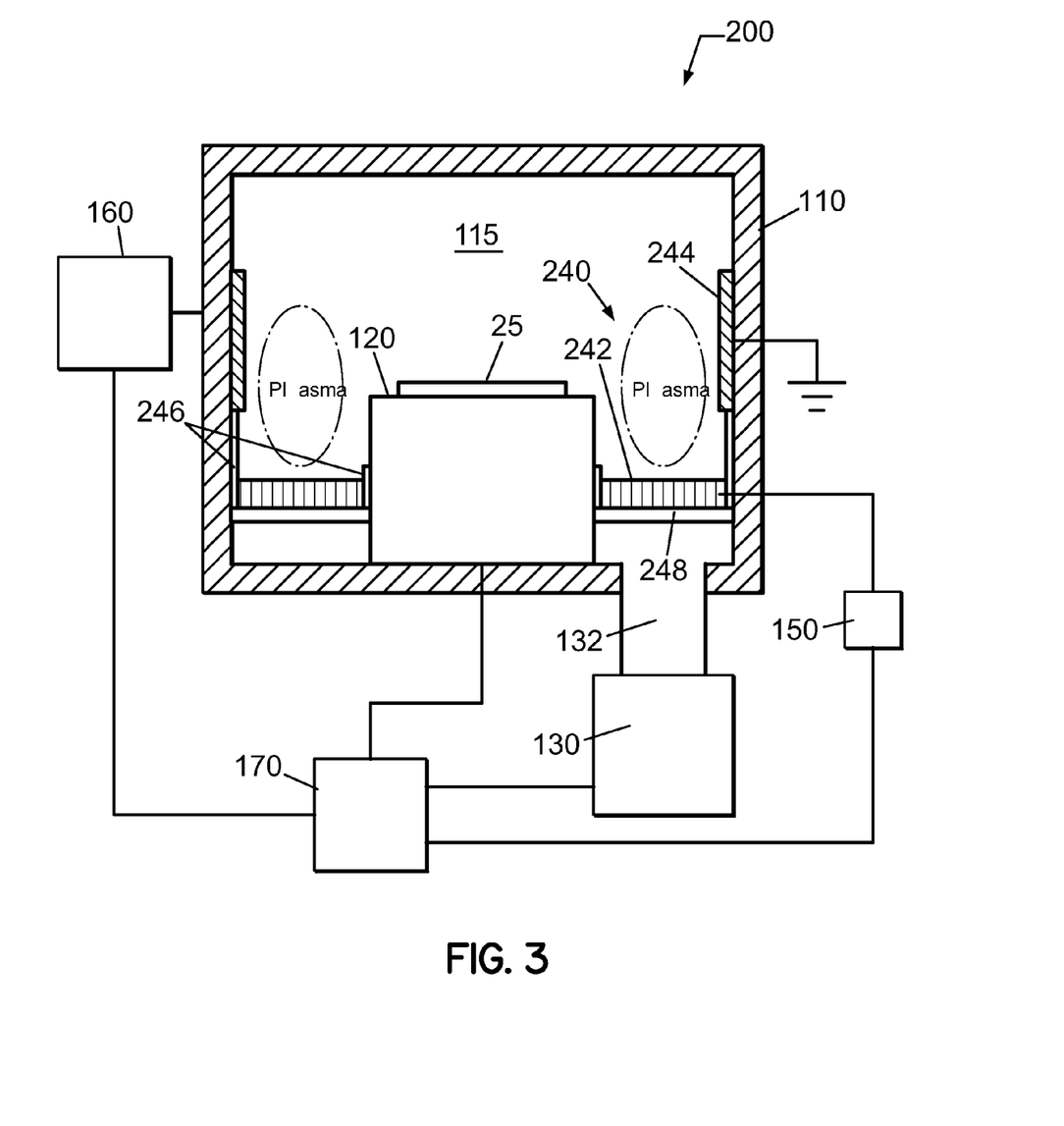
FIG. 3 presents a schematic representation of a plasma processing system having an exhaust assembly according to another embodiment of the invention.

Referring now to FIG. 3, a processing system 300 and an exhaust assembly therefor are provided according to another embodiment of the invention. A plasma processing system 200 is illustrated comprising an exhaust assembly 240 configured to generate secondary plasma about the periphery of substrate holder 120. Plasma processing system 200 comprises similar components as described in FIG. 2, wherein like reference numerals designate identical or corresponding parts. The exhaust assembly 240 comprises a first exhaust plate 242 coupled to power source 150, a ground electrode 244 coupled to an outer wall of process chamber 110, and electrical insulator rings 246 configured to electrically insulate the first exhaust plate 242 from substrate holder 120 and the (electrically grounded) walls of process chamber 110. Additionally, exhaust assembly 240 can include an optional second exhaust plate 248 located proximate to and below the first exhaust plate 242. The second exhaust plate 248 is fabricated from an electrically non-conductive material. As illustrated in FIG. 3, the first exhaust plates 242 and the ground electrode 244 surround substrate holder 120 and form the secondary plasma there-between.

The first exhaust plate 242 and the ground electrode 244 can be fabricated from a metal, such as aluminum or anodized aluminum. Additionally, the first exhaust plate 242 and the ground electrode 244 can be coated with a ceramic, such as aluminum oxide or yttrium oxide. For example, the exhaust plate 242 and the ground electrode 244 may be coated with a material selected from the group consisting of $Al_2O_3$, $Sc_2O_3$, $Sc_2F_3$, $YF_3$, $La_2O_3$, $Y_2O_3$, and $DyO_3$. The optional second exhaust plate 248 can be fabricated from a ceramic or plastic material. For example, the second exhaust plate 248 may be fabricated from quartz, sapphire, silicon, silicon nitride, silicon carbide, alumina, aluminum nitride, Teflon®, polyimide, etc.

Figure 4:
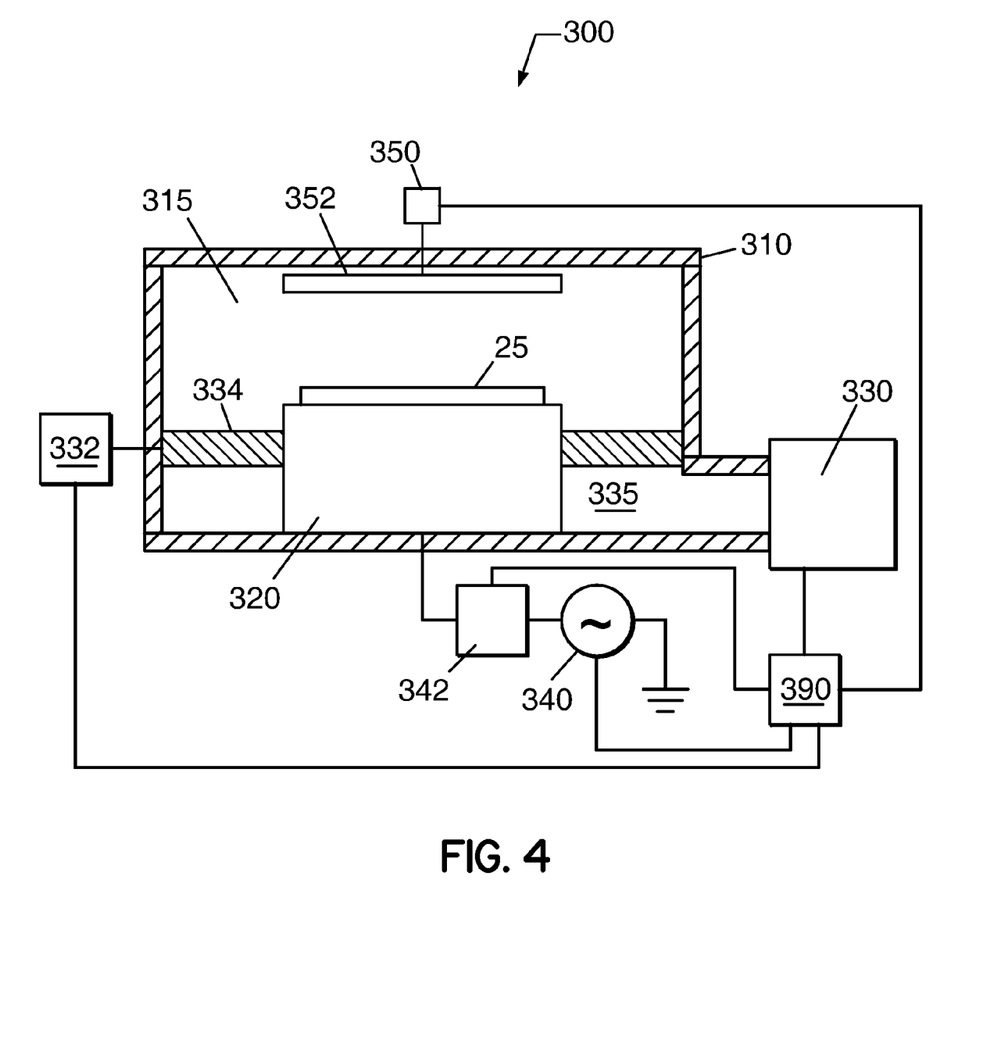
FIG. 4 shows a schematic diagram of a plasma processing system according to an embodiment of the invention.

FIG. 4 illustrates a plasma processing system 300 according to another embodiment. Plasma processing system 300 comprises a plasma processing chamber 310, substrate holder 320, upon which a substrate 25 to be processed is affixed, and vacuum pumping system 330. Substrate 25 can be a semiconductor substrate, a wafer or a liquid crystal display. Plasma processing chamber 310 can be configured to facilitate the generation of plasma in processing region 315 adjacent a surface of substrate 325. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 300 can be configured to process a substrate of any size, such as 200 mm substrates, 300 mm substrates, or larger.

Substrate 25 can be affixed to the substrate holder 320 via an electrostatic clamping system. Furthermore, substrate holder 320 can further include a cooling system or heating system that includes a re-circulating fluid flow that receives heat from substrate holder 320 and transfers heat to a heat exchanger system (not shown) when cooling, or transfers heat from the heat exchanger system to the fluid flow when heating. Moreover, gas can be delivered to the back-side of substrate 25 via a backside gas system to improve the gas-gap thermal conductance between substrate 25 and substrate holder 320. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25. In other embodiments, heating/cooling elements, such as resistive heating elements, or thermoelectric heaters/coolers can be included in the substrate holder 320, as well as the chamber wall of the plasma processing chamber 310 and any other component within the plasma processing system 300.

In the embodiment shown in FIG. 4, substrate holder 320 can comprise an electrode through which RF power is coupled to the processing plasma in process space 315. For example, substrate holder 320 can be electrically biased at a RF voltage via the transmission of RF power from a RF generator 340 through an optional impedance match network 342 to substrate holder 320. The RF bias can serve to heat electrons to form and maintain plasma, or affect the ion energy distribution function within the sheath, or both. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Furthermore, impedance match network 342 serves to improve the transfer of RF power to plasma in plasma processing chamber 310 by reducing the reflected power. Match network topologies (e.g. L-type, π-type, T-type, etc.) and automatic control methods are well known to those skilled in the art.

Referring still to FIG. 4, plasma processing system 300 further comprises an optional direct current (DC) power supply 350 coupled to an upper electrode 352 opposing substrate 25. The upper electrode 352 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 350 can further include a system configured to perform at least one of monitoring adjusting, or controlling the polarity, current, voltage, or on/off state of the DC power supply 50. Once plasma is formed, the DC power supply 350 facilitates the formation of a ballistic electron beam. An electrical filter may be utilized to de-couple RF power from the DC power supply 350.

For example, the DC voltage applied to electrode 352 by DC power supply 350 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 352. The surface of the upper electrode 352 facing the substrate holder 320 may be comprised of a silicon-containing material.

Furthermore, the amplitude of the RF power coupled to substrate holder 320 can be modulated in order to affect changes in the spatial distribution of the electron beam flux to substrate 25. Additional details can be found in co-pending U.S. patent application Ser. No. 11/495,726, entitled "Method and system for controlling the uniformity of a ballistic electron beam by RF modulation" (Lee Chen & Ping Jiang), filed on Jul. 31, 2006; the entire contents of which are incorporated by reference in their entirety.

Referring still to FIG. 4, plasma processing system 300 further comprises an exhaust assembly 334 surrounding substrate holder 320 and configured to separate processing space 315 from pumping space 335. The exhaust system 334 is coupled to power source 332 and configured to generate secondary plasma to reduce plasma leakage from process space 315 to pumping space 335, and improve the spatial uniformity of processing plasma in process space 315. For example, the exhaust assembly 334 can include either embodiment described in FIGS. 2 or 3.

Vacuum pumping system 330 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 310. The pressure measuring device can be, for example, a Type 628B Baratron absolute capacitance manometer commercially available from MKS Instruments, Inc. (Andover, Mass.).

Referring still to FIG. 4, plasma processing system 300 further comprises a controller 390 that comprises a microprocessor, memory, and a digital I/O port capable of generating control voltages sufficient to communicate and activate inputs to plasma processing system 300 as well as monitor outputs from plasma processing system 300. Moreover, controller 390 can be coupled to and can exchange information with RF generator 340, impedance match network 342, optional DC power supply 350, the gas injection system (not shown), power source 332, vacuum pumping system 330, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 300 according to a process recipe in order to perform the method of etching a thin film. One example of controller 390 is a DELL PRECISION WORKSTATION 610™, available from Dell Corporation (Austin, Tex.).

Controller 390 may be locally located relative to the plasma processing system 300, or it may be remotely located relative to the plasma processing system 300 via an internet or intranet. Thus, controller 390 can exchange data with the plasma processing system 300 using at least one of a direct connection, an intranet, or the internet. Controller 390 may be coupled to an intranet at a customer site (i.e., a device maker, etc.), or coupled to an intranet at a vendor site (i.e., an equipment manufacturer). Furthermore, another computer (i.e., controller, server, etc.) can access controller 390 to exchange data via at least one of a direct connection, an intranet, or the internet.

In the embodiment shown in FIG. 5, the plasma processing system 300 can be similar to the embodiment of FIG. 3 or 4 and further comprise either a stationary, or mechanically or electrically rotating magnetic field system 460, in order to potentially increase plasma density and/or improve plasma processing uniformity, in addition to those components described with reference to FIG. 3. Moreover, controller 490 can be coupled to magnetic field system 60 in order to regulate the speed of rotation and field strength. The design and implementation of a rotating magnetic field is well known to those skilled in the art.

Figure 6:
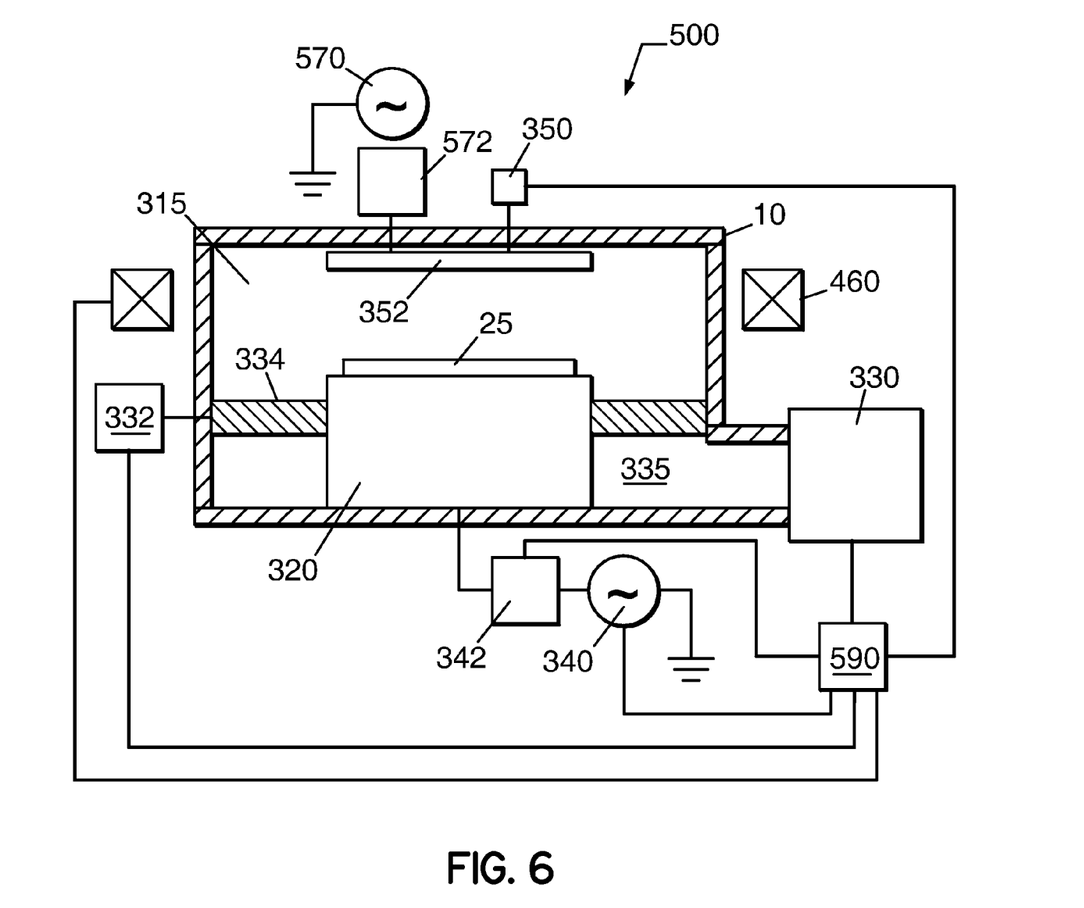
FIG. 6 shows a schematic diagram of a plasma processing system according to another embodiment of the invention.

In the embodiment shown in FIG. 6, the plasma processing system 500 can be similar to the embodiment of FIG. 3 or FIG. 4, and can further comprise an RF generator 570 configured to couple RF power to upper electrode 352 through an optional impedance match network 572. A typical frequency for the application of RF power to upper electrode 352 can range from about 0.1 MHz to about 200 MHz. Additionally, a typical frequency for the application of power to the substrate holder 320 (or lower electrode) can range from about 0.1 MHz to about 100 MHz. For example, the RF frequency coupled to the upper electrode 352 can be relatively higher than the RF frequency coupled to the substrate holder 20. Optionally, the RF power to the upper electrode 352 from RF generator 570 can be amplitude modulated, or the RF power to the substrate holder 320 from RF generator 340 can be amplitude modulated, or both RF powers can be amplitude modulated. Desirably, the RF power at the higher RF frequency is amplitude modulated. Moreover, controller 590 is coupled to RF generator 570 and impedance match network 572 in order to control the application of RF power to upper electrode 352. The design and implementation of an upper electrode is well known to those skilled in the art.

Referring still to FIG. 6, the optional DC power supply 350 may be directly coupled to upper electrode 352, or it may be coupled to impedance match network 572 to upper electrode 352. An electrical filter may be utilized to de-couple RF power from DC power supply 350.

Figure 5:
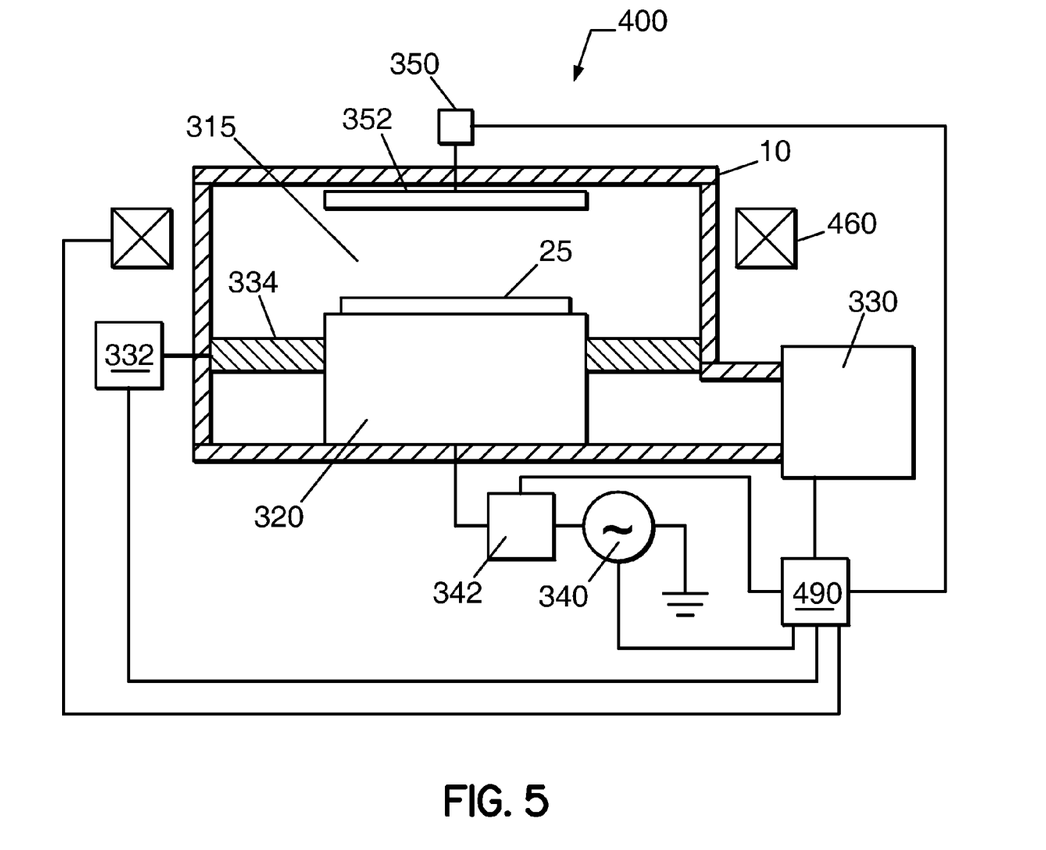
FIG. 5 shows a schematic diagram of a plasma processing system according to another embodiment of the invention.
Figure 7:
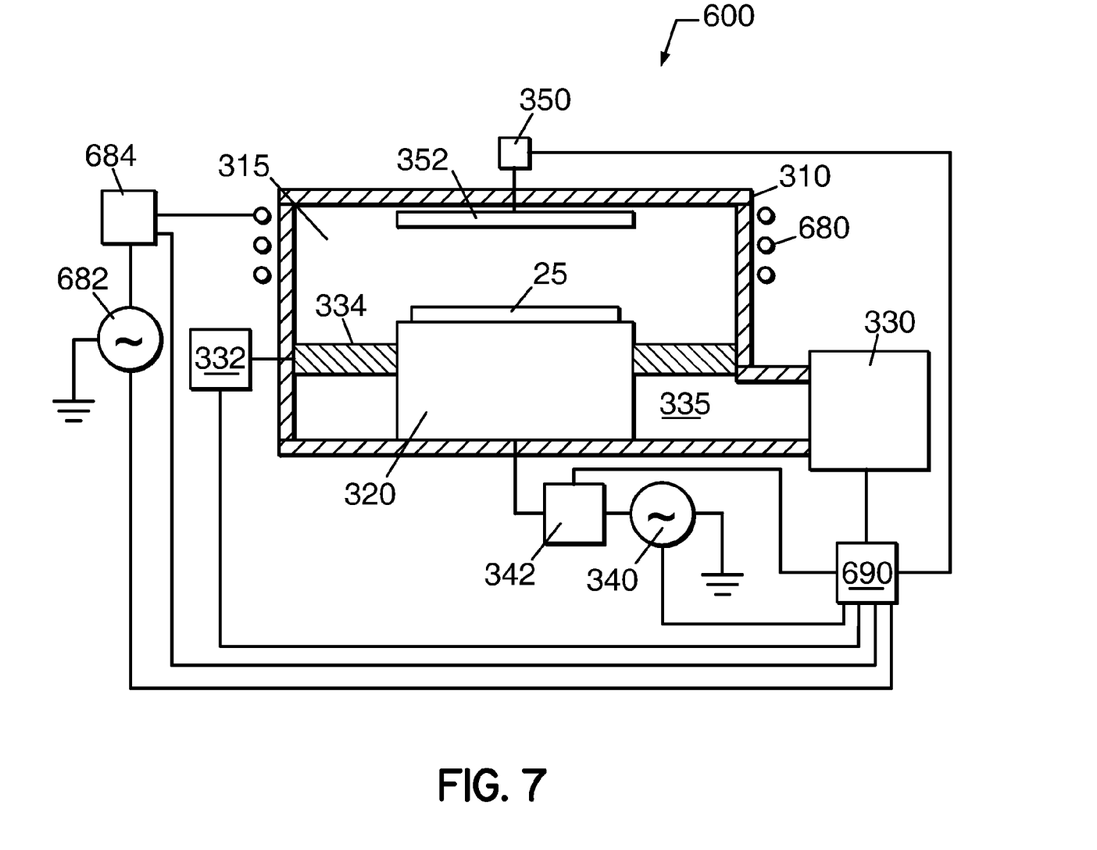
FIG. 7 shows a schematic diagram of a plasma processing system according to another embodiment of the invention.

In the embodiment shown in FIG. 7, the plasma processing system 600 can, for example, be similar to the embodiments of FIGS. 3, 4 and 5, and can further comprise an inductive coil 680 to which RF power is coupled via RF generator 682 through an optional impedance match network 684. RF power is inductively coupled from inductive coil 680 through a dielectric window (not shown) to plasma processing region 315. A typical frequency for the application of RF power to the inductive coil 680 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 680 and plasma. Moreover, controller 690 is coupled to RF generator 682 and impedance match network 684 in order to control the application of power to inductive coil 680. In an alternate embodiment, inductive coil 680 can be a "spiral" coil or "pancake" coil in communication with the plasma processing region 315 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 8:
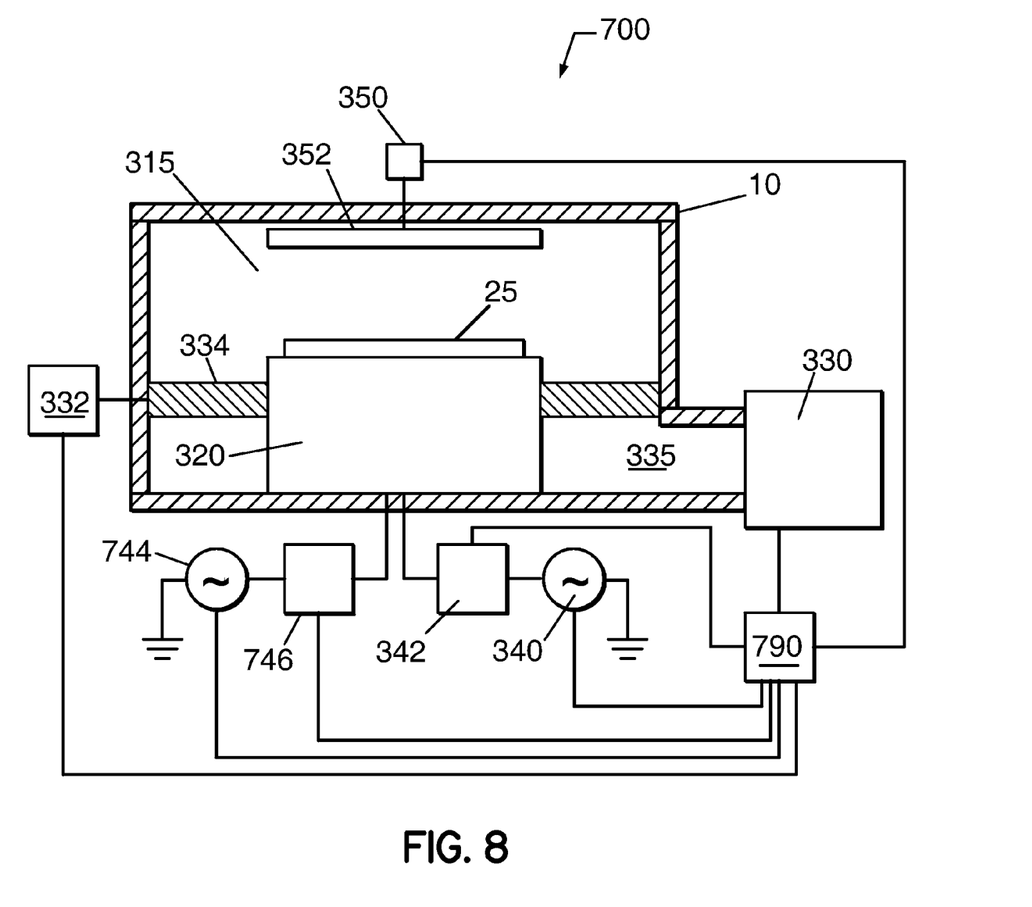
FIG. 8 shows a schematic diagram of a plasma processing system according to another embodiment of the invention.

In the embodiment shown in FIG. 8, the plasma processing system 700 can, for example, be similar to the embodiments of FIGS. 3, 4 and 5, and can further comprise a second RF generator 744 configured to couple RF power to substrate holder 320 through another optional impedance match network 746. A typical frequency for the application of RF power to substrate holder 320 can range from about 0.1 MHz to about 200 MHz for either the first RF generator 340 or the second RF generator 744 or both. The RF frequency for the second RF generator 744 can be relatively greater than the RF frequency for the first RF generator 744. Furthermore, the RF power to the substrate holder 320 from RF generator 340 can be amplitude modulated, or the RF power to the substrate holder 320 from RF generator 744 can be amplitude modulated, or both RF powers can be amplitude modulated. Desirably, the RF power at the higher RF frequency is amplitude modulated. Moreover, controller 790 is coupled to the second RF generator 744 and impedance match network 746 in order to control the application of RF power to substrate holder 320. The design and implementation of an RF system for a substrate holder is well known to those skilled in the art.

In the following discussion, a method of etching a thin film utilizing a plasma processing system is presented. For example, the plasma processing system can comprise various elements, such as described in FIGS. 2 through 8, and combinations thereof.

Figure 9:
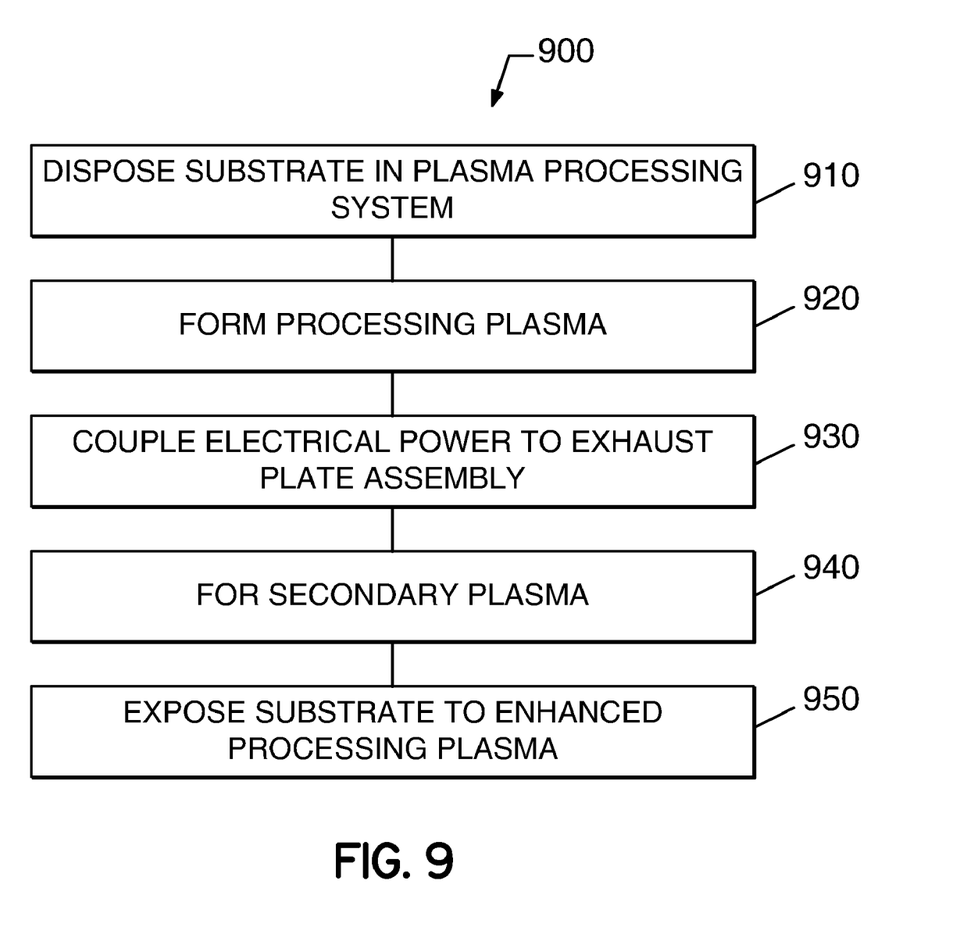
FIG. 9 illustrates a method of treating a substrate using plasma according to certain embodiments of the invention.

FIG. 9 presents a flow chart of a method for etching a thin film using a plasma processing system according to an embodiment of the present invention. Procedure 900 begins at 910 with disposing a substrate on a substrate holder in a plasma processing system configured to form a processing plasma.

In 920, the processing plasma is formed in a process space proximate the substrate by coupling electrical power, such as RF power, to a process gas introduced to the plasma processing system. The plasma generation system may include any known device configured to generate plasma, such as those described above and in FIG. 4 through FIG. 8.

In 930, electrical power is coupled to an exhaust assembly. The exhaust assembly is disposed within the plasma processing chamber and configured to surround the substrate holder. The exhaust assembly separates the process space from a pumping space coupled to a vacuum pumping system below the exhaust assembly. Electrical power can include DC power or AC power, such as RF power. In 940, secondary plasma is formed beyond a peripheral edge of the substrate holder using the exhaust assembly in order to alter the processing plasma by, for example, reducing the leakage of the processing plasma to the vacuum pumping system. The exhaust assembly can include either embodiment presented in FIGS. 2 and 3.

In 950, the substrate is exposed to the altered processing plasma in order to, for example, etch one or more features on the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of etching a thin film on a substrate using a plasma processing system, comprising:
    disposing said substrate on a substrate holder in a plasma processing chamber;
    forming a processing plasma in a process space above and adjacent said substrate using a plasma generation system coupled to said plasma processing chamber;
    disposing an exhaust assembly within said plasma processing chamber such that said exhaust assembly substantially surrounds said substrate holder and separates said process space from a pumping space coupled to a vacuum pumping system;
    coupling electrical power to said exhaust assembly thereby forming a secondary plasma in order to alter said processing plasma;
    exposing said substrate to said altered processing plasma;
    the disposing of the exhaust assembly comprising:
        disposing a first exhaust plate around said substrate holder, said first exhaust plate having a plurality of openings to allow passage of process gas there-through;
        electrically insulating said first exhaust plate from said substrate holder and said plasma processing chamber; and
        disposing a second exhaust plate around said substrate holder, parallel with said first exhaust plate and below said first exhaust plate, said second exhaust plate having a plurality of openings to allow passage of process gas there-through;
    wherein said first exhaust plate is coupled to an electrical power source and said second exhaust plate is coupled to an electrical ground, and wherein said secondary plasma is formed between said first exhaust plate and said second exhaust plate during said coupling of electrical power.

2. The method of claim 1, wherein said coupling of electrical power comprises coupling direct current (DC) power or alternating current (AC) power to said exhaust assembly.

3. The method of claim 1, wherein said coupling of electrical power comprises coupling radio frequency (RF) power to said exhaust assembly.

4. The method of claim 1, wherein:
    the coupling of electrical power to said exhaust assembly includes coupling the electrical power to the exhaust assembly form said secondary plasma to alter said processing plasma so as to improve the spatial uniformity thereof.

5. A method of etching a thin film on a substrate using a plasma processing system, comprising:
    disposing said substrate on a substrate holder in a plasma processing chamber;
    forming a processing plasma in a process space above and adjacent said substrate using a plasma generation system coupled to said plasma processing chamber;
    disposing an exhaust assembly within said plasma processing chamber such that said exhaust assembly substantially surrounds said substrate holder and separates said process space from a pumping space coupled to a vacuum pumping system;
    coupling electrical power to said exhaust assembly thereby forming a secondary plasma in order to alter said processing plasma;
    exposing said substrate to said altered processing plasma;
    the disposing of the exhaust assembly comprising:
        disposing a first exhaust plate around said substrate holder, said first exhaust plate having a plurality of openings to allow passage of process gas there-through;
        electrically insulating said first exhaust plate from said substrate holder and said plasma processing chamber; and
        disposing a ground electrode on an outer wall of said plasma processing chamber, perpendicular with said first exhaust plate and above said first exhaust plate;
    wherein said first exhaust plate is coupled to an electrical power source and said ground electrode is coupled to an electrical ground, and wherein said secondary plasma is formed between said first exhaust plate and said ground electrode during said coupling of electrical power.

6. The method of claim 5, wherein said disposing of said exhaust assembly further comprises:

disposing a second exhaust plate around said substrate holder, parallel with said first exhaust plate and immediately below said first exhaust plate, said second exhaust plate having a plurality of openings to allow passage of process gas there-through.

7. The method of claim 5, wherein said coupling of electrical power comprises coupling direct current (DC) power or alternating current (AC) power to said exhaust assembly.

8. The method of claim 5, wherein said coupling of electrical power comprises coupling radio frequency (RF) power to said exhaust assembly.

9. The method of claim 5, wherein:

the coupling of electrical power to said exhaust assembly includes coupling the electrical power to the exhaust assembly to form said secondary plasma in such a way as to alter said processing plasma so as to improve the spatial uniformity thereof.

* * * * *

UNITED STATES PATENT AND TRADEMARK OFFICE
CERTIFICATE OF CORRECTION

PATENT NO. : 7,416,677 B2  
APPLICATION NO. : 11/464003  
DATED : August 26, 2008  
INVENTOR(S) : Hiroyuki Takahashi Page 1 of 1

It is certified that error appears in the above-identified patent and that said Letters Patent is hereby corrected as shown below:

On the Title Page, Item (57) in lines 7-8 of the Abstract, "ground electrode is utilized to form the secondary plasma" should read -- ground electrode utilized to form the secondary plasma --.

In the Drawings, FIG. 9, Box 540, "FOR SECONDARY PLASMA", should read -- FORM SECONDARY PLASMA --.

In column 6, line 42, "at least one of monitoring adjusting, or controlling", should read -- at least one of monitoring, adjusting, or controlling --.

In Column 10, line 33, Claim 4, "assembly form said secondary plasma", should read -- assembly to form said secondary plasma --.

Signed and Sealed this

Twenty-seventh Day of October, 2009

David J. Kappos  
*Director of the United States Patent and Trademark Office*